United States Patent
Mosley

(10) Patent No.: US 7,180,724 B2
(45) Date of Patent: Feb. 20, 2007

(54) ELECTROLYTIC POLYMER CAPACITORS FOR DECOUPLING POWER DELIVERY, PACKAGES MADE THEREWITH, AND SYSTEMS CONTAINING SAME

(75) Inventor: Larry E. Mosley, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 10/957,068

(22) Filed: Sep. 30, 2004

(65) Prior Publication Data

US 2006/0067033 A1 Mar. 30, 2006

(51) Int. Cl.
*H01G 4/228* (2006.01)

(52) U.S. Cl. .................. 361/306.2; 361/512; 361/516; 361/523; 361/525; 361/528

(58) Field of Classification Search ................ 361/528, 361/306.1–306, 303, 302–305, 502–504, 361/508–512, 516–519, 523–534; 438/107–110
See application file for complete search history.

(56) References Cited

U.S. PATENT DOCUMENTS

| | | | |
|---|---|---|---|
| 5,672,377 A * | 9/1997 | Amano et al. | 427/80 |
| 6,704,192 B2 * | 3/2004 | Pekala | 361/502 |
| 6,781,817 B2 * | 8/2004 | Andelman | 361/503 |
| 6,845,003 B2 * | 1/2005 | Oyama et al. | 361/502 |
| 6,869,827 B2 * | 3/2005 | Vaiyapuri | 438/109 |
| 7,043,300 B2 * | 5/2006 | O'Phelan et al. | 607/5 |

* cited by examiner

*Primary Examiner*—Nguyen T. Ha
(74) *Attorney, Agent, or Firm*—Schwegman, Lundberg, Woessner & Kluth, P.A.

(57) ABSTRACT

In an embodiment, an electrolytic polymer capacitor includes a metal first electrode and a polymer-containing second electrode. The first electrode includes an etched metal film including a macroscopic first surface area and a microscopic second surface area, and the microscopic second surface area is larger that the macroscopic first surface area 22 Claims, 3 Drawing Sheets

ELECTROLYTIC POLYMER CAPACITORS FOR DECOUPLING POWER DELIVERY, PACKAGES MADE THEREWITH, AND SYSTEMS CONTAINING SAME

TECHNICAL FIELD

Embodiments relate to electrolytic capacitors that are used for processor decoupling, among other uses.

TECHNICAL BACKGROUND

Electrical circuits often include capacitors for various purposes such as filtering, bypassing, power decoupling, and performing other functions. High-speed digital integrated circuits such as processors and computer chipsets in particular exhibit improved performance when the power supplied to the integrated circuit is filtered with a capacitor placed physically close to the integrated circuit.

Such power decoupling capacitors function to smooth out irregularities in the voltage supplied to the integrated circuits, and so serve to provide the integrated circuits with a more ideal voltage supply.

By placing the decoupling capacitors near the integrated circuit, parasitic impedances such as printed circuit board path resistance or inductance are minimized, which allows easy and efficient transfer of energy from the decoupling capacitor to the integrated circuit. Minimization of series resistance and inductance in the capacitor itself is also desirable for the same purposes, and it results in a more efficient and desirable decoupling or bypass capacitor.

The internal series resistance of the capacitor is typically known as the Equivalent Series Resistance, or ESR. Similarly, internal series inductance is known as Equivalent Series Inductance, or ESL. Both of these parameters can be measured for a given capacitor, and they are among the basic criteria used to select capacitors for applications such as integrated circuit power supply decoupling.

Efforts to minimize ESL and ESR have included solutions such as using multiple types of capacitors in parallel or combination series-parallel configurations, configured to produce the desired capacitance at the very low ESR and ESL levels required. For example, tantalum capacitors in the order of 4.7 µF in parallel with 0.01 µF ceramic chip capacitors were often sufficient for lower-speed digital logic circuits of previous decades. New high-speed digital logic circuits such as high-performance computer processors require both greater capacitance because of the amount of power dissipated, and lower ESR and ESL because of the very high speeds at which the processors operate.

It is also desirable for capacitors to have a small footprint for packaging that does take an unduly large amount of printed circuit board space. This is why space-efficient capacitor technologies are often implemented in circuits despite typically having relatively high inductance, high resistance, high dielectric absorption, and other unfavorable characteristics.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

The following description includes terms, such as upper, lower, first, second, etc., that are used for descriptive purposes only and are not to be construed as limiting. The embodiments of a device or article described herein can be manufactured, used, or shipped in a number of positions and orientations.

The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials.

A board is typically a resin-impregnated fiberglass structure that acts as a mounting substrate for the die. A board can be prepared with a bond pad, also referred to as a bond finger, that is flush with the board, or the bond pad can be set upon the board surface. As depicted in this disclosure, a bond pad is not limited to being flush or being set upon the surface only because it is illustrated as such, unless it is explicitly stated in the text.

A "solder bump" or "electrical bump" is understood to be a unit of electrically conductive material such as a tin-lead solder, a tin-indium solder, a tin-bismuth solder, a tin-silver solder, or other solders that are used in the microelectronic arts. The terms "solder bump" and "electrical bump" can be used interchangeably. Additionally, other electrical communication structures can be used, such as a pin in a pin-grid array.

Figure 1:
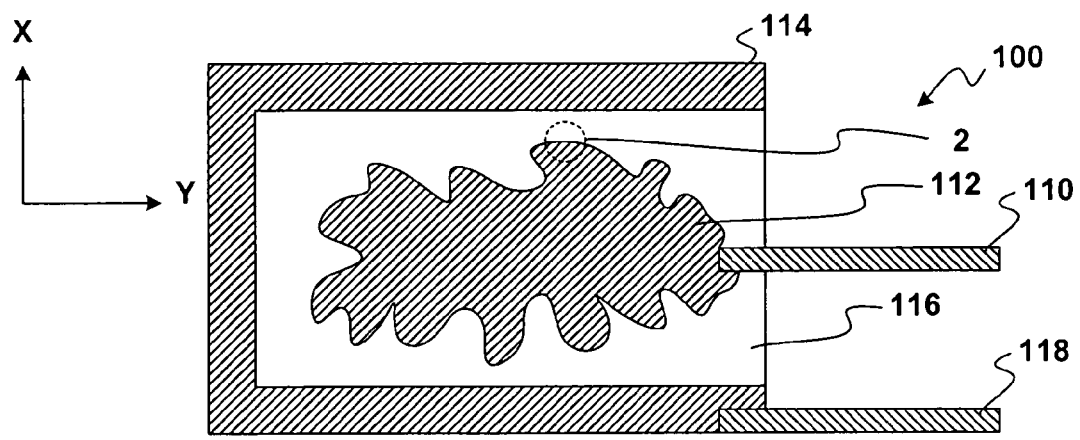
FIG. 1 is a cross-section of an electrolyte capacitor package including a metal first electrode and an electrically conductive polymer according to an embodiment.

FIG. 1 is a cross-section of an electrolyte capacitor package 100 including a metal first electrode 112 and an electrically conductive polymer 116 according to an embodiment. The metal first electrode 112 includes a metal or an electrically conductive metal oxide or both.

A second electrode 114 is also provided. A first portion of the second electrode 114, which is alternatively referred to as a "can" 114, acts as an envelope for the metal first electrode 112. A second portion of the second electrode 114 also includes the electrically conductive polymer 116. A dielectric material 113 (FIG. 2) is disposed between the metal first electrode 112 and the second electrode 114 and 116. In an embodiment, the second electrode consists of the metal and the conductive polymer.

The electrolyte capacitor package 100 further includes a first lead 110 that is the electrical contact to the metal first electrode 112. Further, the electrolyte capacitor package 100 includes a second lead 118 that includes the electrical contact to the second electrode, which includes the can 114 and the electrically conductive polymer 116.

In an embodiment, the metal first electrode 112 includes a metal selected from tantalum, niobium, a combination thereof, and the like. In an embodiment, the metal first electrode 112 includes a metal selected from aluminum, aluminum alloys, copper-aluminum (copper most prevalent), aluminum-copper (aluminum most prevalent), combinations thereof, and the like. In an embodiment, the metal first electrode 112 includes a metal selected from zirconium, hafnium, a combination thereof, and the like.

In an embodiment, the metal first electrode 112 is configured in an embodiment to include a high surface area such as metal spheroids. In an embodiment, the metal first electrode 112 is configured to include a high surface area such as tantalum spheroids. In an embodiment, the metal first electrode 112 is configured to include a high surface area such as niobium spheroids.

In an embodiment, the metal first electrode 112 includes a high surface area metal such as a surface-etched aluminum foil. In an embodiment, the first electrode includes an etched metal film including a macroscopic first surface area and a microscopic second surface area and the microscopic second surface area is larger that the macroscopic first surface area.

Conductive Polymers

In an embodiment, the conductive polymer 116 is a long, carbon-based chain composed of simple repeating units. In an embodiment, the conductive polymer 116 is a graft polymer. In an embodiment, the conductive polymer 116 is a block polymer. In an embodiment, the conductive polymer 116 is prepared from an oligomer.

In an embodiment, the polymer polyaniline is used. Polyaniline can be obtained under the name ORMECON® from the ORMECON subsidiary of Zipperling Kessler & Co. located at Ferdinand-Harten-Straße 7, D-22949 Ammersbek, Germany. In an embodiment, a thermochromatic and conductive lacquer mix is used. This mix is a mix of a polymer such as polyaniline and a metallic or conductive material such as Minatec®, a colored to somewhat clear conductive plastic available from EM Industries of Hawthorne, N.Y. In an embodiment, Minatec® or the like is added in a particular concentration to appropriately vary conductivity.

In an embodiment, conductive polymer embodiments are formed by converting single-bond carbon chains to polymer backbones with alternating single and double bonds. This change provides a pathway for free-electron-charge carriers. In an embodiment, the conductive polymer 116 is formed from polyaniline and the like. In an embodiment, the conductive polymer 116 is formed from polyphenylene-vinylene and the like. In an embodiment, the conductive polymer 116 is formed from polythiophene and the like. In an embodiment, the conductive polymer 116 is formed from polypyrrole and the like. In an embodiment, the conductive polymer 116 is formed from polyacetylene and the like. In an embodiment, the conductive polymer 116 is selected from polyacetylene, polydiacetylene, polytriacetylene, and combinations thereof. In an embodiment, the conductive polymer 116 is formed from poly-p-phenylene and the like. In an embodiment, the conductive polymer 116 is formed from polyfuran and the like. In an embodiment, the conductive polymer 116 is formed from betacarotene and the like. In an embodiment, the conductive polymer 116 is formed from substituted forms of these molecules and other similar conjugated oligomer materials.

In an embodiment, the conductive polymer 116 is tuned by the length and/or the composition of side chains (R groups). A non-limiting example is the alteration of polyphenylene-vinylene (PPV) by alteration of R groups. Substitution of different R groups onto PPV, such as alkoxy groups results in different electrical properties. Substitution of an alkyl or an aryl R group leads to a changed electrical property. By adjusting the length and/or R group composition, the number of distinguishable conductive polymers 116 can be in the tens of thousands or higher. In an embodiment, the molecular weight of the conductive polymers 116 is in a range from about 1,000 atomic mass units to about 1,000,000. In an embodiment, the molecular weight of the conductive polymers 116 is in a range from about 10,000 atomic mass units to about 100,000.

Figure 2:
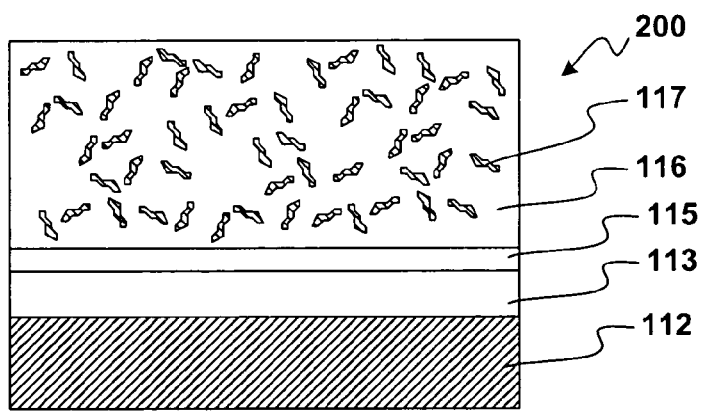
FIG. 2 is a detail of the cross-section depicted in FIG. 1 that illustrates the capacitor structure at the anode according to an embodiment.

In an embodiment, the conductive polymer 116 is attached to the metal oxide layer 115 (see FIG. 2). In an embodiment the conductive polymer 116 is attached directly to the metal oxide layer 115 with terminal acetylene bonds.

In an embodiment, attachment is assisted with linker molecules. Homo- or hetero-bifunctional linker molecules are available from various commercial sources. Linker molecules include, but are not limited to, alkyl groups and alkyl groups containing heteroatom moieties, with short alkyl groups, esters, epoxy groups and ethylene glycol and derivatives.

FIG. 2 is a detail 200 (taken from section 2 in FIG. 1) of the cross-section depicted in FIG. 1 that illustrates the capacitor structure at the anode according to an embodiment. In an embodiment, the metal first electrode 112 acts as the anode in the electrolyte capacitor package 100 (FIG. 1). Accordingly, the metal first electrode 112 is used to establish a capacitative potential across a dielectric layer 113 such as a dielectric metal oxide. In an embodiment, the dielectric layer 113 includes tantala ($Ta_2O_5$). In an embodiment, the dielectric layer 113 includes niobia ($Nb_2O_5$). In an embodiment, the dielectric layer 113 includes zirconia ($Zr_2O_3$).). In an embodiment, the dielectric layer 113 includes alumina ($Al_2O_3$). Other metal oxides that are useful as dielectrics can be used.

In an embodiment, the electrically conductive metal oxide is present as an electrically conductive metal oxide layer 115. Accordingly, as depicted FIG. 2, the capacitor structure includes a metal first electrode 112, a tantala dielectric layer 113, an electrically conductive metal oxide layer 115, and an electrically conductive polymer 116. Other structures such as the can 114 (FIG. 1) are includable as structures for the electrolyte capacitor package 100 (FIG. 1).

In an embodiment, the conductive polymer 116 includes a combination of polymer materials and discrete structure in the polymer 116 such as electrically conductive inorganic particles 117. In an embodiment, the electrically conductive inorganic particles 117 include carbon fibers. In an embodiment, the electrically conductive inorganic particles 117 include carbon nanotubes. The carbon nanotubes can have a size range, in diameter, from about 20 nm to about 80 nm, and the length-to-diameter aspect ratio thereof can be in a range from about 1:1 to about 200:1. In an embodiment, the electrically conductive inorganic particles 117 include metal spheroids. In an embodiment, the electrically conductive inorganic particles 117 include diamond particles. In an embodiment, the electrically conductive inorganic particles 117 include carbon particles. In an embodiment, the electrically conductive inorganic particles 117 include two of the above. In an embodiment, the electrically conductive inorganic particles 117 include three of the above.

Figure 3:
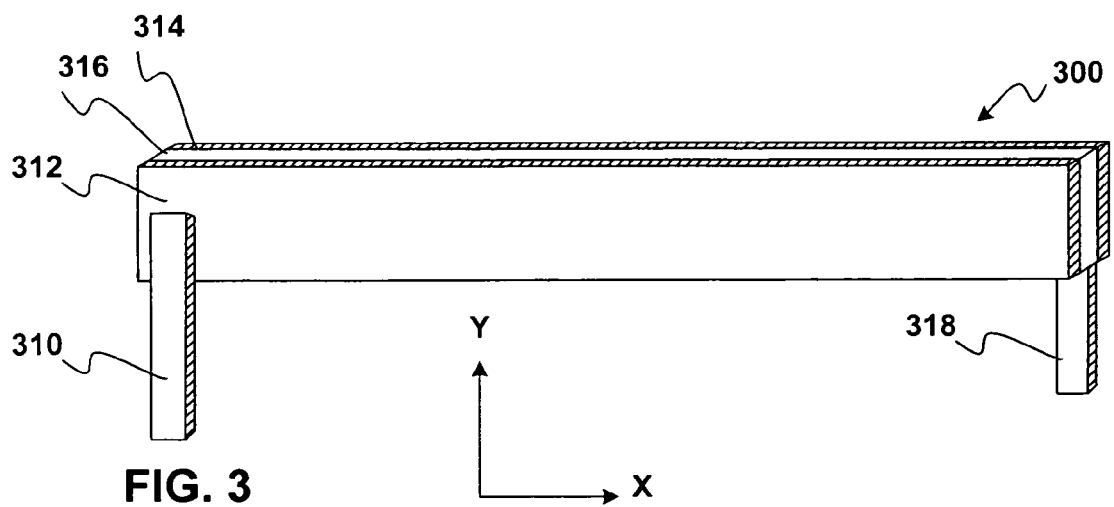
FIG. 3 is a perspective elevation of an electrolyte capacitor structure before complete assembly according to an embodiment.

FIG. 3 is a perspective elevation of an electrolyte capacitor structure 300 before complete assembly according to an embodiment. In an embodiment, a metal first electrode 312 includes an etched aluminum foil that is in contact with a first lead 310. An aluminum foil second electrode 314, likewise with an etched surface, is provided as the second electrode. An electrically conductive polymer 316 is disposed between the first electrode 312 and the second electrode 314. Any of the disclosed electrically conductive polymers 116 and their equivalents are useable in this embodiment.

Electrical contact to the outside world is accomplished with a first lead 310 that is welded or otherwise affixed to the first electrode 312, and a second lead 318 that is likewise welded or otherwise affixed to the second electrode 314. After preparation of the electrolyte capacitor structure 300 as depicted, the structure is rolled about the Y-axis in a spiral, such that the anode 312 as the first electrode, and the cathode 318 as the second electrode are proximate each other across the approximate radius of the rolled electrolyte capacitor structure 300.

Figure 4:
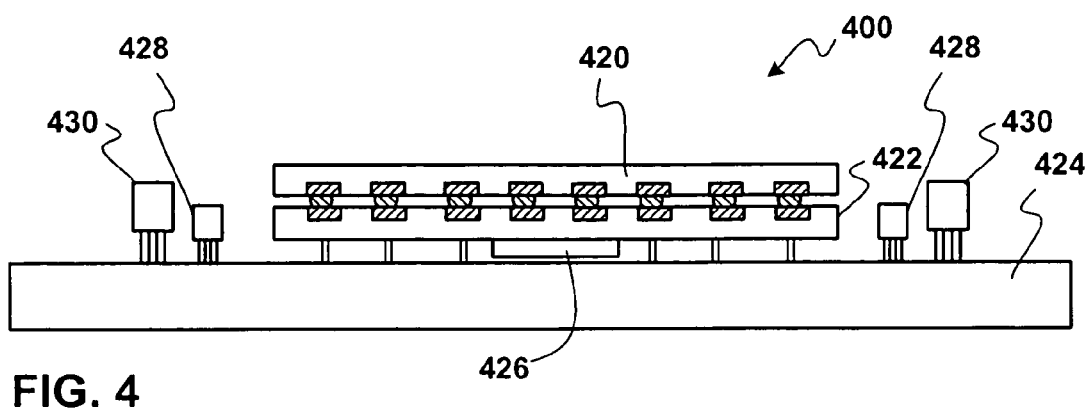
FIG. 4 is a cross-section of a flip-chip microelectronic device package including a capacitor according to an embodiment.

FIG. 4 is a cross-section of a flip-chip microelectronic device package 400 according to an embodiment. A microelectronic die 420 is mounted in C4 (controlled-collapse chip connect) fashion onto a mounting substrate 422. The mounting substrate 422 is depicted as being further mounted onto a board 424 such as a motherboard.

In an embodiment, the board 424 is part of a printed wiring board (PWB) such as a main board. In an embodiment, the board 424 is part of an interposer. In an embodiment, the board 424 is part of a mezzanine PWB. In an embodiment, the board 424 is part of an expansion card PWB. In an embodiment, the board 424 is part of a small PWB such as a board for a handheld device such as a cell phone or personal digital assistant (PDA).

A high-frequency capacitor 426 is disposed directly beneath the microelectronic die 420 such that it may quickly respond to load transients generated by the microelectronic die 420 during its optimum performance. A high-frequency bulk first capacitor 428 is disposed adjacent the microelectronic die 420 on the board 424. Electrical communication (not pictured) is achieved between the microelectronic die 420 and the high-frequency bulk first capacitor 428 through the board 424 and the mounting substrate 422. In an embodiment, any embodiment of the electrolyte capacitor package set forth in this disclosure can be disposed in the position of the high-frequency bulk first capacitor 428. In an embodiment, a bulk second capacitor 430 is likewise disposed upon the board 424 and makes electrical communication with the microelectronic die through the board 424 and the mounting substrate 422. Similarly, any embodiment of the electrolyte capacitor package, as set forth in this disclosure, can be positioned and operated as a bulk second capacitor 430.

As depicted in FIG. 4, the structure represents a package, including the board 424 and either one of the high-frequency bulk first capacitor 428 or the bulk second capacitor 420. In an embodiment, the package 400 includes the microelectronic die 420 and at least one of the high-frequency bulk first capacitor 428 or the bulk second capacitor 430. Where only one of the capacitors 428 and 430 is present, it is properly designated as a "first capacitor".

Similarly, the package 400 as depicted in FIG. 4, according to an embodiment, includes the microelectronic die 420 disposed above the board 424, a "first capacitor" 428 or 430, and a second capacitor 426 that is coupled to the microelectronic die 420. Accordingly, the first capacitor 428 or 430 has a greater capacity than the high-frequency second capacitor 426, but the second capacitor 426 has a faster response time than the first capacitor 428 or 430. In an embodiment, the second capacitor 426 includes a shorter communication path to the microelectronic die 420 than the first capacitor 428 or 430. Accordingly, the load transient needs of the microelectronic die are addressed by placing the faster-response-time capacitor with a shorter communication path to the microelectronic die 420 than the greater-capacity capacitor 428 or 430 according to any of the electrolyte capacitor package embodiments set forth in this disclosure.

Figure 5:
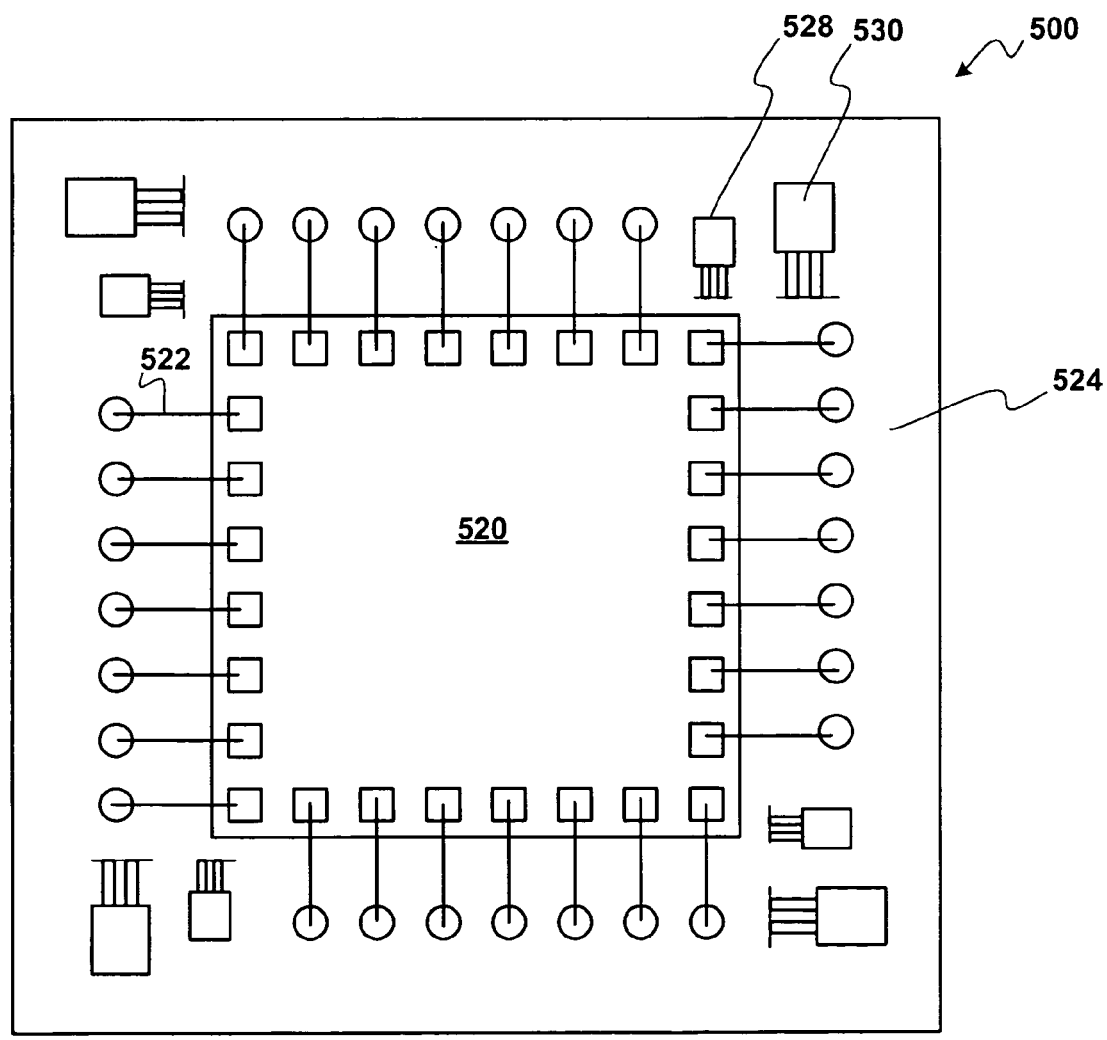
FIG. 5 is a plan view of a wire-bond microelectronic device package including a capacitor according to an embodiment.

FIG. 5 is a plan view of a wire-bond microelectronic device package 500 including a capacitor according to an embodiment. A microelectronic die 520 is depicted as disposed upon a board 524 and is wire-bonded with a bond wire 522. A bulk first capacitor 528 is disposed proximate the microelectronic die 520 according to an embodiment. In an embodiment, a bulk second capacitor 530 is also disposed upon the board 524, but the bulk second capacitor 530 is disposed farther from any point of the microelectronic die 520 than the bulk first capacitor 528.

The relative sizes of the bulk first capacitor 528 and the bulk second capacitor 530 are depicted as being respectively smaller and larger. The relative sizes illustrate a package embodiment such that bulk first capacitor 528 includes a smaller capacity than the bulk second capacitor 530. The relative sizes do not, however, illustrate a response time of the bulk first capacitor 528 that is faster than the bulk second capacitor 530. One reason for a faster response time of the bulk first capacitor 528 is that the bulk first capacitor 528 includes a shorter communication path to the microelectronic die 520 than the bulk second capacitor 530.

Figure 6:
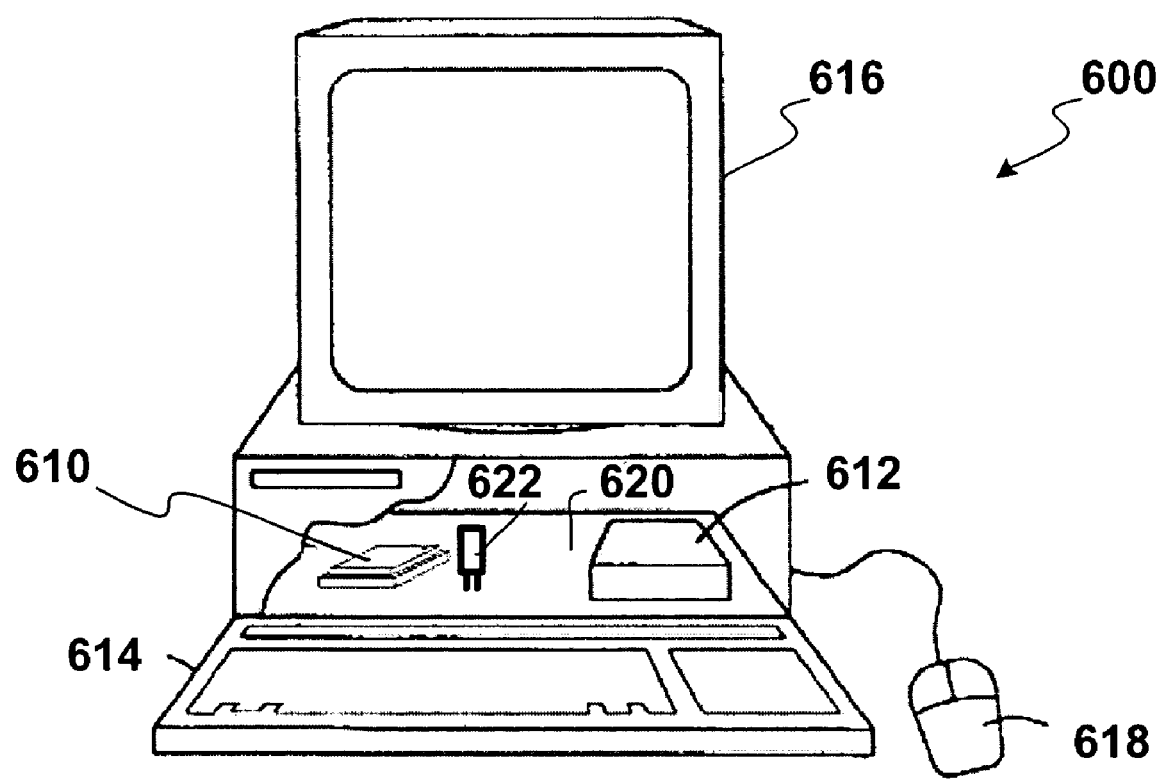
FIG. 6 is a depiction of a computing system according to an embodiment.

FIG. 6 is a depiction of a computing system 600 according to an embodiment. One or more of the foregoing embodiments of an electrolyte capacitor package may be utilized in a computing system, such as a computing system 600 of FIG. 6. The computing system 600 includes at least one processor (not pictured), which is enclosed in a package 610, a data storage system 612, at least one input device such as keyboard 614, and at least one output device such as monitor 616, for example. The computing system 600 includes a processor that processes data signals, and may include, for example, a microprocessor available from Intel Corporation. In addition to the keyboard 614, the computing system 600 can include another user input device such as a mouse 618, for example.

For purposes of this disclosure, a computing system 600 embodying components in accordance with the claimed subject matter may include any system that utilizes an electrolyte capacitor package 622, which may be coupled to a mounting substrate 620, for example, for a data storage device such as dynamic random access memory, polymer memory, flash memory, and phase-change memory. The electrolyte capacitor package embodiment can also be coupled to a mounting substrate 620 for a die that contains a digital signal processor (DSP), a micro-controller, an application specific integrated circuit (ASIC), or a microprocessor.

Embodiments set forth in this disclosure can be applied to devices and apparatuses other than a traditional computer. For example, a die can be packaged with an embodiment of the electrolyte capacitor package placed in a portable device such as a wireless communicator or a hand-held device such as a personal digital assistant and the like. Another example is a die that can be packaged with an electrolyte capacitor package and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages that have been described and illustrated in order to explain the nature of this inventive subject matter may be made without departing from the principles and scope of the inventive subject matter as expressed in the subjoined claims.

What is claimed is:

1. A capacitor comprising:
   a metal first electrode, wherein the first electrode includes an etched metal film including a macroscopic first surface area and a microscopic second surface area, wherein the microscopic second surface area is larger than the macroscopic first surface area;
   a second electrode including:
      a metal or an electrically conductive metal oxide; and
      an electrically conductive polymer; and
   a dielectric disposed between the first electrode and the second electrode.

2. The capacitor of claim 1, wherein the metal first electrode is selected from aluminum, tantalum, niobium, zirconium, hafnium, and combinations thereof.

3. The capacitor of claim 1, wherein the electrically conductive metal oxide includes magnesia ($MnO_2$).

4. The capacitor of claim 1, wherein the second electrode consists of the metal and the conductive polymer.

5. The capacitor of claim 1, wherein the first electrode is an anode, and wherein the second electrode is a cathode.

6. The capacitor of claim 1, wherein the first electrode includes a metal spheroid.

7. The capacitor of claim 1, wherein the first electrode includes a metal spheroid, and wherein the second electrode includes the electrically conductive metal oxide and the conductive polymer.

8. The capacitor of claim 1, wherein the first electrode includes a metal spheroid, and wherein the second electrode includes the magnesia ($MnO_2$) and the conductive polymer.

9. The capacitor of claim 1, wherein the first electrode includes a tantalum spheroid, and wherein the second electrode includes the magnesia ($MnO_2$) and the conductive polymer.

10. The capacitor of claim 1, wherein the first electrode includes an etched aluminum film, and wherein the second electrode includes the magnesia ($MnO_2$) and the conductive polymer.

11. The capacitor of claim 1, wherein the conductive polymer is selected from polyaniline, polyphenylene-vinylene, polythiophene, polypyrrole, polyacetylene, polydiacetylene, polytriacetylene, poly-p-phenylene, polyfuran, betacarotene, and combinations thereof.

12. The capacitor of claim 1, wherein the conductive polymer includes an inorganic article, selected from metal spheroids, carbon fibers, carbon nanotubes, carbon powder, diamond, and combinations thereof.

13. The capacitor of claim 1, wherein the conductive polymer is selected from polyaniline, polyphenylene-vinylene, polythiophene, polypyrrole, polyacetylene, polydiacetylene, polytriacetylene, poly-p-phenylene, polyfuran, betacarotene, and combinations thereof, and wherein the conductive polymer includes an inorganic article, selected from metal spheroids, carbon fibers, carbon nanotubes, carbon powder, diamond, and combinations thereof.

14. A package comprising:
    a board;
    a first capacitor disposed on the board, wherein the first capacitor includes:
       a metal first electrode;
       a second electrode including:
          a metal or an electrically conductive metal oxide; and
          a conductive polymer; and
       a dielectric disposed between the first electrode and the second electrode;
    a die disposed above the board; and
       a second capacitor coupled to the die, wherein the first capacitor has a greater capacity than the second capacitor, wherein the second capacitor includes a faster response capability than the first capacitor, and wherein the second capacitor includes a shorter communication path to the die than the first capacitor.

15. The package of claim 14, further including a die disposed above the board, and wherein the first capacitor is coupled to the die.

16. The package of claim 14, wherein the first capacitor includes a can containing the second electrode, and wherein the first capacitor is coupled to the board by at least two wires.

17. The package of claim 14, wherein the first capacitor includes a can containing the second electrode, and wherein the first capacitor is coupled to the board by at least two bumps.

18. The package of claim 14, wherein the conductive polymer is selected from polyaniline, polyphenylene-vinylene, polythiophene, polypyrrole, polyacetylene, polydiacetylene, polytriacetylene, poly-p-phenylene, polyfuran, betacarotene, and combinations thereof.

19. A computing system comprising:
    a microelectronic die;
    a board, wherein the die is coupled to the board;
    a first capacitor disposed on the board, wherein the first capacitor includes:
       a metal first electrode;
       a second electrode including:
          a metal or an electrically conductive metal oxide; and
          a conductive polymer; and
       a dielectric disposed between the first electrode and the second electrode;
    at least one of an input device and an output device coupled to the microelectronic die;
    dynamic random access data storage coupled to the die; and
    a second capacitor coupled to the die, wherein the first capacitor has a greater capacity than the second capacitor, wherein the second capacitor includes a faster response capability than the first capacitor, and wherein the second capacitor includes a shorter communication path to the die than the first capacitor.

20. The computing system of claim 19, wherein the conductive polymer is selected from polyaniline, polyphenylene-vinylene, polythiophene, polypyrrole, polyacetylene, polydiacetylene, polytriacetylene, poly-p-phenylene, polyfuran, betacarotene, and combinations thereof.

21. The computing system of claim 19, wherein the computing system is disposed in one of a computer, a wireless communicator, a hand-held device, an automobile, a locomotive, an aircraft, a watercraft, and a spacecraft.

22. The computing system of claim 19, wherein the microelectronic die is selected from a data storage device, a digital signal processor, a micro-controller, an application specific integrated circuit, and a microprocessor.

* * * * *